US009627040B1

(12) United States Patent
Chang et al.

(10) Patent No.: US 9,627,040 B1
(45) Date of Patent: Apr. 18, 2017

(54) 6T STATIC RANDOM ACCESS MEMORY CELL, ARRAY AND MEMORY THEREOF

(71) Applicant: NATIONAL TSING HUA UNIVERSITY, Hsinchu (TW)

(72) Inventors: Meng-Fan Chang, Hsinchu (TW); Chien-Fu Chen, Hsinchu (TW); Hiroyuki Yamauchi, Fukuoka (JP)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/944,244

(22) Filed: Nov. 18, 2015

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .................................................... G11C 11/419
USPC .......................................................... 365/154
See application file for complete search history.

(56) References Cited

U.S. PATENT DOCUMENTS 9,001,571 B1 * 4/2015 Chang .................. G11C 11/418 365/154
9,299,422 B1 * 3/2016 Chen ..................... G11C 11/419
2009/0073782 A1 * 3/2009 Hanafi ................... G11C 29/02 365/189.09
2009/0109732 A1 * 4/2009 Houston ............... G11C 11/412 365/154
2014/0112081 A1 * 4/2014 Grover .................. G11C 11/417 365/189.011
2014/0204656 A1 * 7/2014 Kumar .................. G11C 11/419 365/154
2015/0302917 A1 * 10/2015 Grover .................. G11C 11/412 365/51
2016/0372180 A1 * 12/2016 Amara .................. G11C 11/419

* cited by examiner

*Primary Examiner* — Hoai V Ho
*Assistant Examiner* — Jay Radke
(74) *Attorney, Agent, or Firm* — Li & Cai Intellectual Property (USA) Office

(57) ABSTRACT

A 6T static random access memory cell, array, and memory thereof are provided, in which the memory cell includes a first inverter, a second inverter, a first NMOS transistor, and a second NMOS transistor. A first high supply voltage and a low supply voltage are coupled to the first inverter. A second high supply voltage and the low supply voltage are coupled to the second inverter. The first NMOS transistor has a gate terminal coupled to a first word line. The first NMOS transistor has a source terminal coupled to the first node. The second NMOS transistor has a gate terminal coupled to a second word line, and the second NMOS transistor has a source terminal coupled to the second node. The first word line provides ON signals to turn on the first NMOS transistor, and the second high supply voltage provides a first boost voltage simultaneously.

27 Claims, 11 Drawing Sheets

4

6T STATIC RANDOM ACCESS MEMORY CELL, ARRAY AND MEMORY THEREOF

BACKGROUND OF THE INVENTION

1. Field of the Invention

The instant disclosure relates to a static random access memory cell; in particular, to a 6T static random access memory cell, array, and memory thereof.

2. Description of Related Art

In order to reduce required power consumption, minimizing the size of the integrated circuit memory devices in semiconductors is still the direction to strive for. Memory devices in semiconductors include static random access memory (SRAM) and dynamic random access memory (DRAM). DRAM memory cells only have one transistor and a capacitor, which provides high integrability. However, since DRAM has requirements for continuous replacement, high power consumption and slow speed, DRAM is a memory choice limited to mostly computer memories. On the other hand, SRAM cells have bistability, which means with the appropriate power, SRAM can continuously maintain the original state. SRAM can operate in high speed under low power consumption such that computers mostly use a lot of cache SRAM. Other applications include embedded memory, and network device memory.

Conventional structures of common SRAM cells include six transistors (6T) having 6 metal-oxide-semiconductor field-effect transistors. Please refer to FIG. 1 as a circuit diagram of a conventional 6T static random access memory cell. The conventional 6T static random access memory cell 1 includes a first inverter 11, a second inverter 12, a first access transistor M5, and a second access transistor M6. The first inverter 11 includes a first pull-up transistor M1 and a first pull-down transistor M3, whereas the second inverter 12 includes a second pull-up transistor M2 and a second pull-down transistor M4. The first pull-up transistor M1 has a source terminal and the second pull-up transistor M2 has a source terminal cooperatively coupled to a supply voltage VDD. The first pull-down transistor M3 has a source terminal and the second pull-down transistor M4 has a source terminal cooperatively coupled to a low supply voltage VSS. The first pull-down transistor M3 has a drain terminal and the first pull-up transistor M1 has a drain terminal cooperatively coupled to form a first node Q. The second pull-down transistor M4 has a drain terminal and the second pull-up transistor M2 has a drain terminal cooperatively coupled to form a second node QB.

The first NMOS transistor M5 has a gate terminal coupled to a word line WL, a source terminal coupled to the first node Q, and a drain terminal coupled to a first bit line BL. The second NMOS transistor M6 has a gate terminal coupled to the word line WL, a source terminal coupled to the second node QB, and a drain terminal coupled to a second bit line BLB.

Please refer to FIGS. 1 and 2. FIG. 2 is a signal diagram of the conventional 6T static random access memory cell while data are being written thereon and then data are being read therefrom. Generally, in a writing operation, a conventional 6T static random access memory cell 1 must fix the first bit line BL and the second bit line BLB to a group of fixed voltage when data are being written, such that data stored in the first node Q and the second node QB are forced to flip. For a reading operation, the conventional 6T static random access memory cell 1 must pull the electric potential of word line WL to "1" (refer to T2-T3 interval as shown in FIG. 2) when data is being read, which is different from writing, and the electric potential of the first bit line BL must pull up and equal to the second bit line BLB before the electric potential of the word line WL pulls up to "1", and the first bit line BL and the second bit line BLB must have equal electric potentials such as "1" as shown in FIG. 2. When the first bit line BL is equal to the second bit line BLB and floating, the word line WL then provides ON signals. The conventional 6T static random access memory cell uses the storage values of the first node Q and the second node QB, via the first access transistor M5 and the second access transistor M6, and generates charge sharing and voltage division respectively with the first bit line BL and the second bit line BLB, such that difference in electric potential is induced between the first bit line BL and the second bit line BLB. As shown in FIG. 2, electric potential signal of the first bit line BL is affected, thus voltage is reduced. Successively, an external signal amplifier (not illustrated) amplifies differences in signals and read out the voltage value as "0" or "1".

However, the conventional 6T static random access memory cell 1 has a read disturb issue and a write failure issue. Considering the read disturb issue, when the conventional 6T static random access memory cell 1 is reading data, a voltage bump (refer to T2-T3 interval of FIG. 2) occurs at the first node Q. And, the voltage values of the first and second node Q, QB will mutually interfere in time intervals T2 and T3 due to instability of the cell, such that the cell may flip during a reading operation, referred to in the dashed lines in FIG. 3A, wherein the solid lines in FIG. 3A indicates the voltage values of the first and second node Q, QB in a normal reading operation. This problem not only affects the read cell but also the half-selected cells, which is also called half-select disturb. Referring to FIG. 3B, when the selected cell 10 is writing data, the half-selected cells 11 on the selected word line performing dummy read may flip, because the write targeted cell 10 and half selected cells 11 experience the same word line pulse width and voltage level. Considering the write failure issue, as shown in FIG. 3C, the dashed lines indicate unsuccessful flip for the voltage values of the first and second node Q, QB such that writing fails during time intervals T1 and T2, wherein the solid lines in FIG. 3C indicates the voltage values of the first and second node Q, QB in normal writing operation. As a result, there is still much room for improvement in SRAM design.

To address the above issues, the inventor strives via associated experience and research to present the instant disclosure, which can effectively improve the limitation described above.

SUMMARY OF THE INVENTION

The object of the instant disclosure is to provide in an embodiment a 6T static random access memory cell which includes a first inverter, a second inverter, a first NMOS transistor (metal-oxide-semiconductor field-effect transistor), and a second NMOS transistor. The first inverter includes a first pull-up transistor and a first pull-down transistor. The second inverter includes a second pull-up transistor and a second pull-down transistor. The first pull-up transistor has a source terminal coupled to a first high supply voltage. The first pull-down transistor has a source terminal coupled to a low supply voltage. The first pull-down transistor has a drain terminal coupled to a drain terminal of the first pull-up transistor to form a first node. The second pull-up transistor has a source terminal coupled to a second high supply voltage. The second pull-down transistor has a source terminal coupled to the low supply voltage. The second pull-down transistor has a drain terminal coupled to a drain terminal of the second pull-up transistor to form a second node. The first NMOS transistor has a gate terminal coupled to a first word line. The first NMOS transistor has a source terminal coupled to the first node. The second NMOS transistor has a gate terminal coupled to a second word line, and the second NMOS transistor has a source terminal coupled to the second node. The first word line provides ON signals to turn on the first NMOS transistor, and the second high supply voltage provides a first boost voltage simultaneously.

In an embodiment of the disclosure, a 6T static random access memory array is provided which includes a first memory cell. The first memory cell includes a first inverter, a second inverter, a first NMOS transistor, and a second NMOS transistor. The first inverter couples to a first high supply voltage and a low supply voltage. The first inverter has a first node. The second inverter couples to a second high supply voltage and the low supply voltage. The second inverter has a second node. The first NMOS transistor has a gate terminal coupled to a first word line. The first NMOS transistor has a source terminal coupled to the first node. The second NMOS transistor has a gate terminal coupled to a second word line, and the second NMOS transistor has a source terminal coupled to the second node. The first word line provides ON signals to turn on the first NMOS transistor, and the second high supply voltage provides a first boost voltage simultaneously.

In another embodiment, a 6T static random access memory is provided which includes a memory array. The memory array includes at least one memory cell. Each memory cell includes a first inverter, a second inverter, a first NMOS transistor, and a second NMOS transistor. The first inverter includes a first pull-up transistor and a first pull-down transistor. The second inverter includes a second pull-up transistor and a second pull-down transistor. The first pull-up transistor has a source terminal coupled to a first high supply voltage. The first pull-down transistor has a source terminal coupled to a low supply voltage. The first pull-down transistor has a drain terminal coupled to a drain terminal of the first pull-up transistor to form a first node. The second pull-up transistor has a source terminal coupled to a second high supply voltage. The second pull-down transistor has a source terminal coupled to the low supply voltage. The second pull-down has a drain terminal coupled to a drain terminal of the second pull-up transistor to form a second node. The first NMOS transistor has a gate terminal coupled to a first word line. The first NMOS transistor has a source terminal coupled to the first node. The second NMOS transistor has a gate terminal coupled to a second word line, and the second NMOS transistor has a source terminal coupled to the second node. The first word line provides ON signals to turn on the first NMOS transistor, and the second high supply voltage provides a first boost voltage simultaneously.

Accordingly, with the 6T static random access memory cell, array and memory in accordance with the instant disclosure, storage values of the first node and the second node can be prevented from interference due to resistive division during reading or writing data. During data reading, convention circuitry must simultaneously provide voltage to a first NMOS transistor and a second NMOS transistor. However, the instant disclosure provides the memory cell, array, and memory that require only half the voltage the conventional circuitry would require to be provided to the first NMOS transistor. Moreover, pairing of the first word line and the second high supply voltage can immediately obtain the storage value in the first node, which raises voltage effectively. Furthermore, the second word line of the instant disclosure does not provide signals because the storage value of the second node does not affect the storage value in the first node, which is relatively less prone to lose stored data. During writing, the first and second word lines are turned on separately in two different time intervals in order to write. While the first word line turns on during reading, the second high supply voltage also provides a boost voltage such that the stored value of the second node is relatively easier to be written compared to conventional arts.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

The aforementioned illustrations and detailed descriptions are exemplary for the purpose of further explaining the scope of the instant disclosure. Other objectives and advantages related to the instant disclosure will be illustrated in the subsequent descriptions and appended drawings. Terms such as “first, second, third, etc.” are used to describe similar components or parts, but do not limit the amount or the order of importance of the components.

Figure 4:
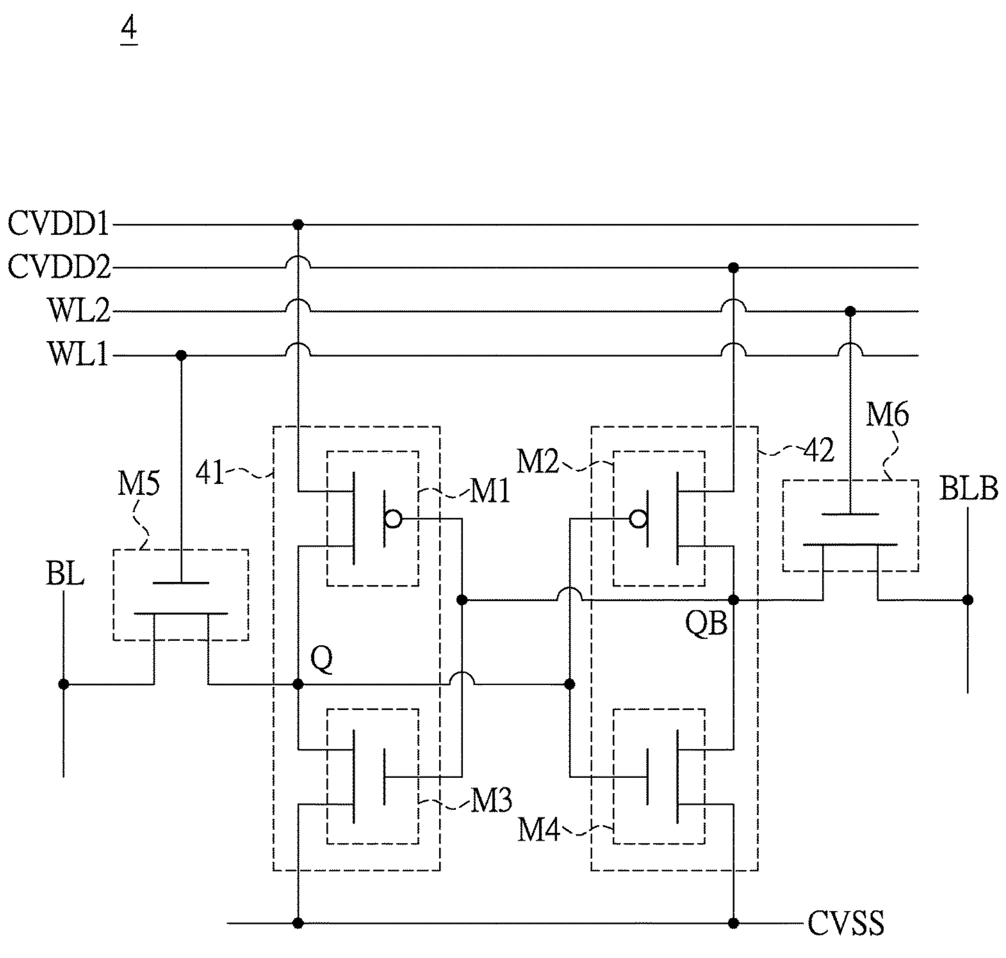
FIG. 4 is a circuit diagram of a 6T static random access memory cell in accordance with the instant disclosure.

Please refer to FIG. 4 as a circuit diagram of a 6T static random access memory cell in accordance with the instant disclosure. The 6T static random access memory cell 4 includes a first inverter 41, a second inverter 42, a first NMOS transistor (metal-oxide-semiconductor field-effect transistors) M5 and a second NMOS transistor M6. The first inverter 41 includes a first pull-up transistor M1 and a first pull-down transistor M3. The second converter 42 includes a second pull-up transistor M2, and a second pull-down transistor M4.

The first pull-up transistor M1 has a source terminal coupled to a first high supply voltage CVDD1. The first pull-down transistor M3 has a source terminal coupled to a low supply voltage CVSS. The first pull-down transistor has a drain terminal coupled to a drain terminal of the first pull-up transistor to form a first node Q. The second pull-up transistor M2 has a source terminal coupled to a second high supply voltage CVDD2. The second pull-down transistor M4 has a source terminal coupled to the low supply voltage CVSS. The second pull-down transistor M4 has a drain terminal coupled to a drain terminal of the second pull-up transistor M2 to form a second node QB. The first pull-down transistor M3 has a gate terminal, and the first pull-up transistor M1 has a gate terminal, and the two gate terminals are coupled to the second node QB. The second pull-down transistor M4 has a gate terminal, and the second pull-up transistor M2 has a gate terminal, and the two gate terminals are coupled to the first node Q. The first NMOS transistor M5 has a gate terminal coupled to a first word line WL1, a source terminal coupled to the first node Q, and a drain terminal coupled to a first bit line BL. The second NMOS transistor M6 has a gate terminal coupled to a second word line WL2, a source terminal coupled to the second node QB, and a drain terminal coupled to a second bit line BLB.

Notably, the first high supply voltage CVDD1 and the second high supply voltage CVDD2 can both have the same supply voltage VDD as a high voltage base.

In the instant disclosure, the first inverter 41 and the second inverter 42 are CMOS static inverters, which are used for forming storage cells. As shown in FIG. 4, the first inverter 41 and the second inverter 42 are formed by two metal-oxide-semiconductor field-effect transistors or MOSFET, which are respectively used as the first pull-up transistor M1 and the first pull-down transistor M3, the second pull-up transistor M2 and the second pull-down transistor M4. The first pull-up transistor M1 and the second pull-up transistor M2, which are respectively connected to the first high supply voltage CVDD1 and the second high supply voltage CVDD2, are P-type metal-oxide-semiconductor transistors or PMOS transistors. The first pull-down transistor M3 and the second pull-down transistor M4, which are connected to the low supply voltage CVSS, are N-type metal-oxide-semiconductor transistors or NMOS transistors. However, the type of transistors, P or N type, are not limited to the arrangement provided in the examples herein. Specifically, the interleaving connection between the first inverter 41 and the second inverter 42 can form a flip-flop for storing data. For example: two different states such as (0, 1) or (1, 0). Notably, the two rounded bits of data information are stored as long as a source of power is continuously supplied thereto. If the power source is removed, the stored data will also be removed.

The first NMOS transistor M5 and the second NMOS transistor M6 are used for controlling the reading and writing of the storage cell. Specifically, the gate terminals of the first NMOS transistor M5 and the second NMOS transistor M6 are respectively coupled to the first word line WL1 and the second word line WL2. When the gate terminals of the first NMOS transistor M5 and the second NMOS transistor M6 receive ON signals through the first word line WL1 and second word line WL2, the first NMOS transistor M5 and second NMOS transistor M6 are turned on, such that the first bit line BL, the second bit line BLB, the first NMOS transistor M5, and the second NMOS transistor M6 mutually affect one another in order to read data from or write data into the memory cell.

Notably, the first high supply voltage CVDD1 and the second high supply voltage CVDD2 of the instant disclosure are two separate high voltage supplies, while the first word line WL1 and the second word line WL2 are similarly two separate ends providing ON signals.

Figure 5A:
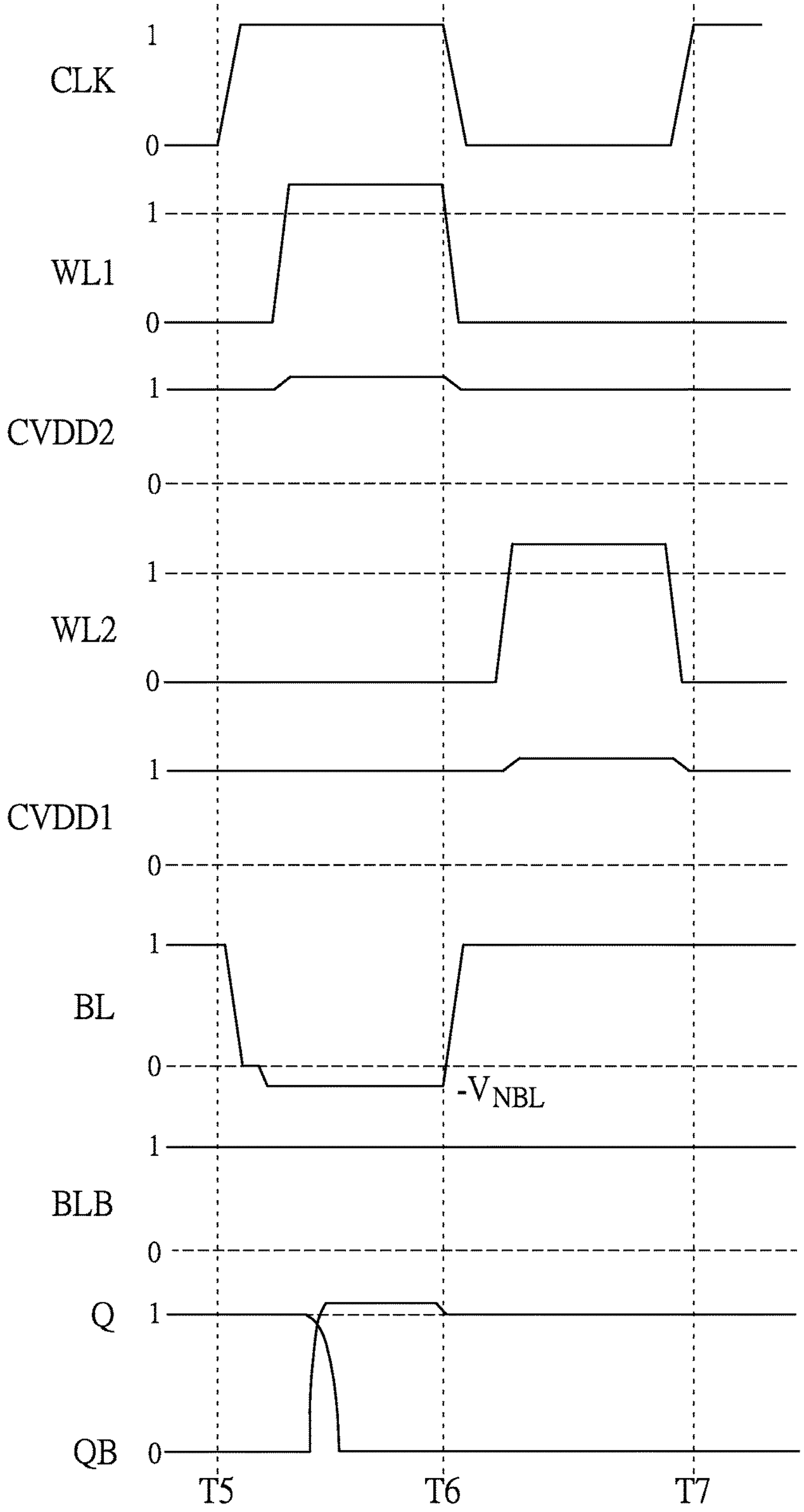
FIG. 5A is a signal diagram of the 6T static random access memory cell while data are being written thereon in accordance with the instant disclosure.
Figure 5B:
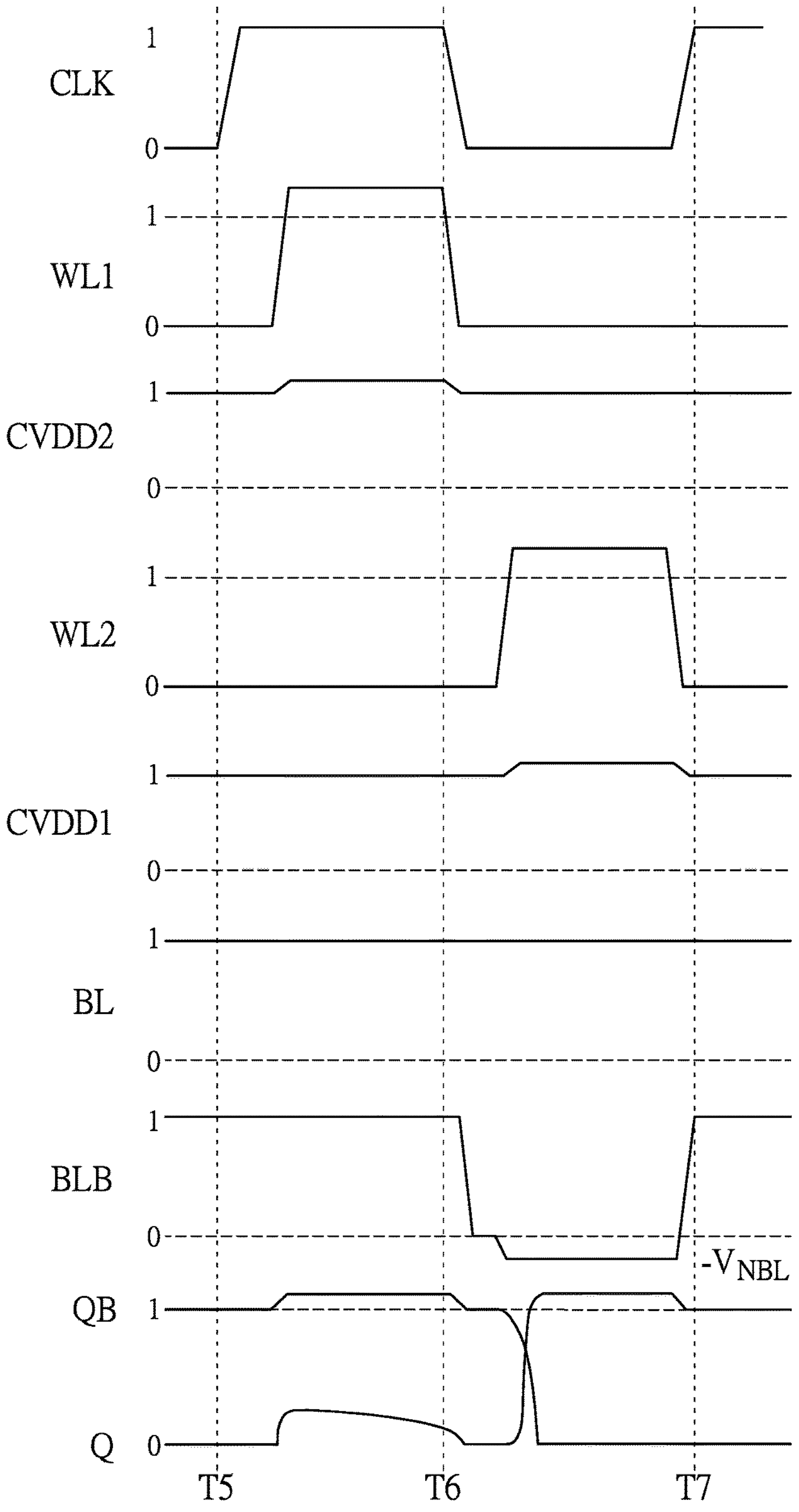
FIG. 5B is a signal diagram of the 6T static random access memory cell while data are being written thereon in accordance with the instant disclosure.

Please refer to FIGS. 4, 5A and 5A. FIG. 5A and FIG. 5B are respectively a signal diagram of the 6T static random access memory cell while data are being written thereon in accordance with the instant disclosure. The following discloses the 6T static random access memory cell while data are being written as the signal changes with storage values variations for the first node Q and the second node QB. The 6T static random access memory cell of the instant disclosure has two write phases. A writing "0" operation, as illustrated in FIG. 5A, is executed in a first write phase T5-T6 of a cycle method. A writing "1" operation, as illustrated in FIG. 5B, is executed in a second write phase T6-T7 of a cycle method.

For example, referring to FIG. 5A showing the writing "0" operation, the first node Q and the second node QB respectively begin with the storage values "1" and "0". If it is preferred to write from "1" to "0" in the first node Q, while writing from "0" to "1" in the second node QB, the voltage of the first bit line BL is preferably reduced to "0", whereas the voltage of the second bit line BLB is preferably raised to "1". Then, while data are being written in the first write phase T5-T6, the electric potential of the first bit line BL is equal to "0" or less than "0" (for example, the voltage of the first bit line BL can be $-V_{NBL}$ shown in FIG. 5A), and the electric potential of the second bit line BLB is equal to "1" such as the first high supply voltage CVDD1 (or second supply voltage CVDD2), or the first high supply voltage CVDD1 plus the boost voltage $V_{DDA}$ (or the second high supply voltage CVDD2 plus the boost voltage $V_{DDB}$, which would be explained in the writing "1" operation described hereinafter). Moreover, during the first write phase T5-T6, the first world line WL1 provides ON signals to the gate terminal of the first NMOS transistor M5, and the second high voltage supply CVDD2 simultaneously provides a boost voltage $V_{DDA}$, that is the second high voltage supply CVDD2 is changed to VDD+$V_{DDA}$, in order to mitigate write failure. Accordingly, the first pull-up transistor M1, the second pull-up transistor M2, the first pull-down transistor M3, and the second pull-down transistor M4 changes the state of the first node Q storage value from "1" to "0" and second node QB storage value from "0" to "1". Then, after the first write phase T5-T6, the first bit line BL is preferably raised to "1", and the second bit line BLB is maintained at "1" in the second write phase T6-T7. For the writing "0" operation, the first high voltage supply CVDD1 and the second high voltage supply CVDD2 in the second write phase T6-T7 which will be described in the descriptions of the writing "1" operation hereinafter will not affect the voltage status of the first node Q and the second node QB. In other words, the data written in the first write phase T5-T6 will not change in the second write phase T6-T7.

Notability, the ON signals of the first word line WL1 can be equal to or greater than the supply voltage VDD in order to mitigate write failure. As shown in FIG. 5A, the ON signal of the first word line WL1 is greater than the supply voltage VDD which is indicated as "1" in logical representation. For example, the ON signal of the first word line WL1 can be VDD+ΔVDD1. That is, before the ON signal is conducting the first NMOS transistor M5, a first initialization electric potential of the first word line WL1 can be a logic high level voltage (VDD) plus a first delta voltage (ΔVDD1).

Considering the writing "1" operation executed in the second write phase T6-T7 shown in FIG. 5B, the first node Q and the second node QB respectively begin with the storage values "0" and "1", and the voltages of the first bit line BL and the second bit line BLB are maintained at "1" in the first write phase T5-T6. While data are being written in the second write phase T6-T7, the electric potential of the second bit line BLB is equal to "0" or less than "0" (for example, the voltage of the second bit line BLB can be $-V_{NBL}$ shown in FIG. 5B). The voltage of the first bit line BL is still maintained at "1". Moreover, in the second write phase T6-T7, the second word line WL2 provides an ON signal to the gate terminal of the second NMOS transistor M6, and the first high voltage supply CVDD1 simultaneously provides a boost voltage $V_{DDB}$, that is the first high voltage supply CVDD1 is changed to VDD+$V_{DDB}$, in order to mitigate write failure. The boost voltage $V_{DDB}$ can be different from the boost voltage $V_{DDA}$. Alternatively, the boost voltage $V_{DDB}$ can be equal to the boost voltage $V_{DDA}$ (that is $V_{DDA}$ is equal to $V_{DDB}$), but the instant disclosure is not limited thereto. Accordingly, the first pull-up transistor M1, the second pull-up transistor M2, the first pull-down transistor M3, and the second pull-down transistor M4 change the state of the first node Q storage value from "0" to "1" and the second node QB storage value from "1" to "0".

Notability, the ON signal of the second word line WL2 can be equal to or greater than the supply voltage VDD in order to mitigate write failure. Similar to the first word line WL1, the ON signal of the second word line WL2 can be VDD+ΔVDD2. That is, before the ON signal is conducting the second NMOS transistor M6, a second initialization electric potential of the second word line WL2 is the logic high level voltage (VDD) plus a second delta voltage (ΔVDD2). The voltage ΔVDD1 and voltage ΔVDD2 can have the same voltage value. Moreover, the voltage ΔVDD1 and voltage ΔVDD2 can also be two different values in other embodiments.

Figure 1:
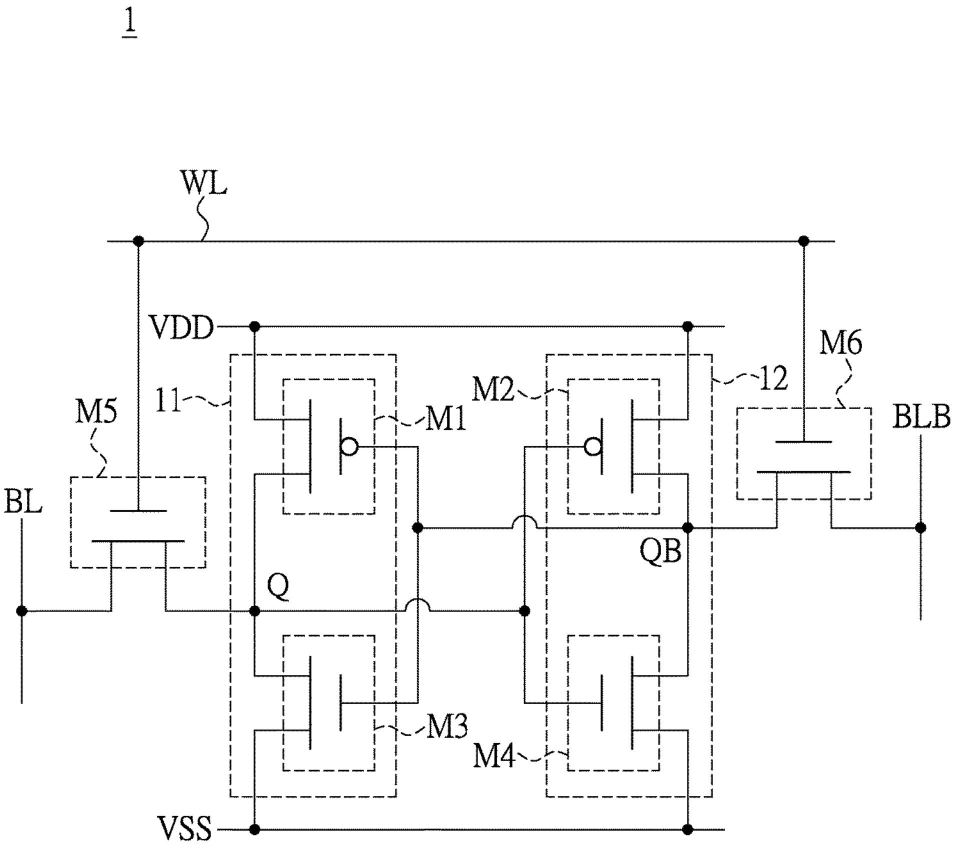
FIG. 1 is a circuit diagram of a conventional 6T static random access memory cell.
Figure 2:
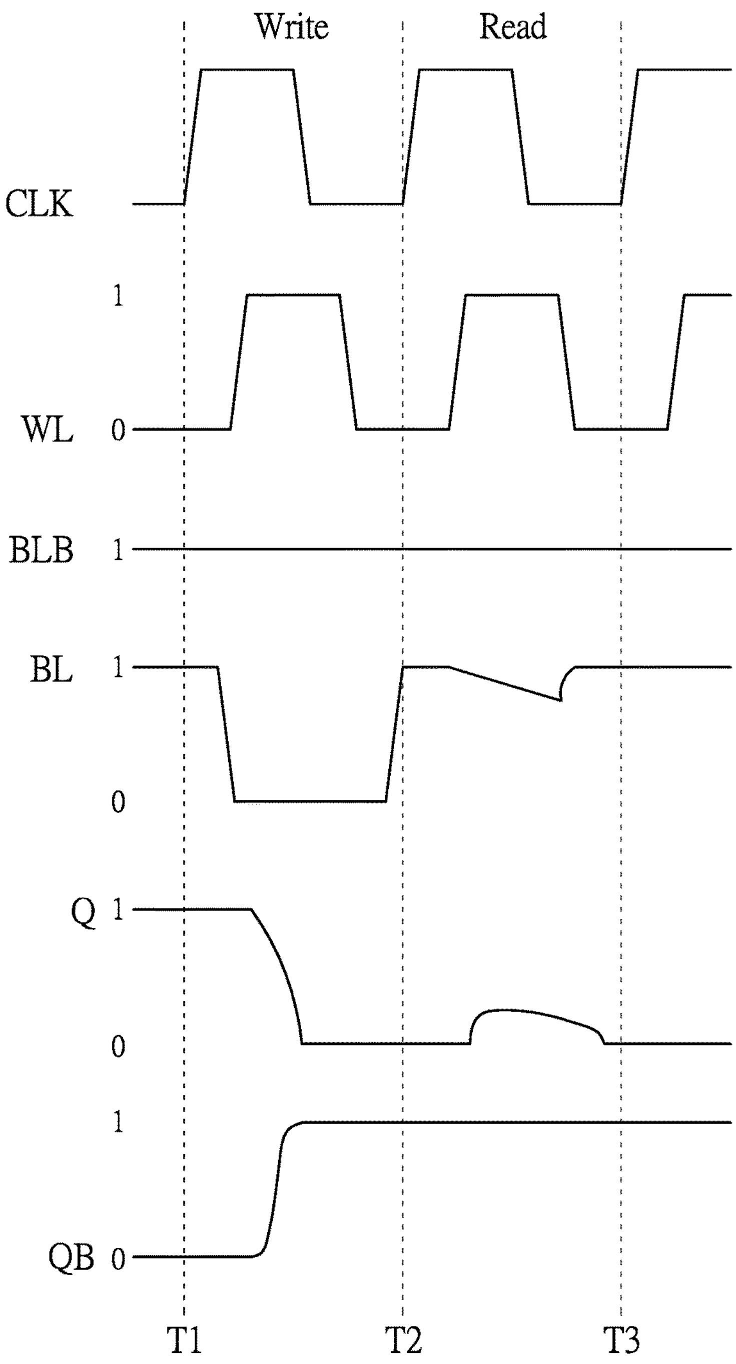
FIG. 2 is a signal diagram of the conventional 6T static random access memory cell while data are being written thereon and then data are being read therefrom.
Figure 3A:
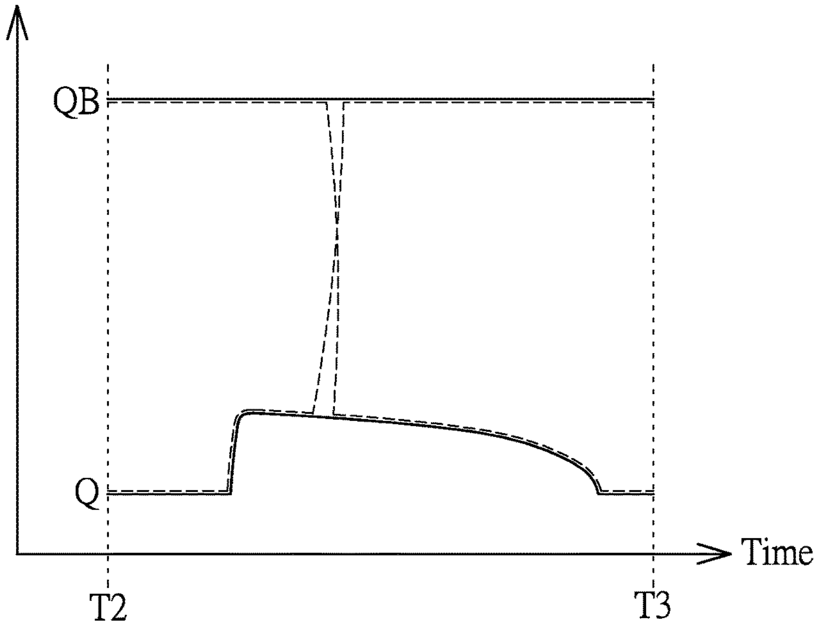
FIG. 3A is a signal diagram of the voltage values of the first node Q and the second node QB of the conventional 6T static random access memory cell while data are being read therefrom.
Figure 3B:
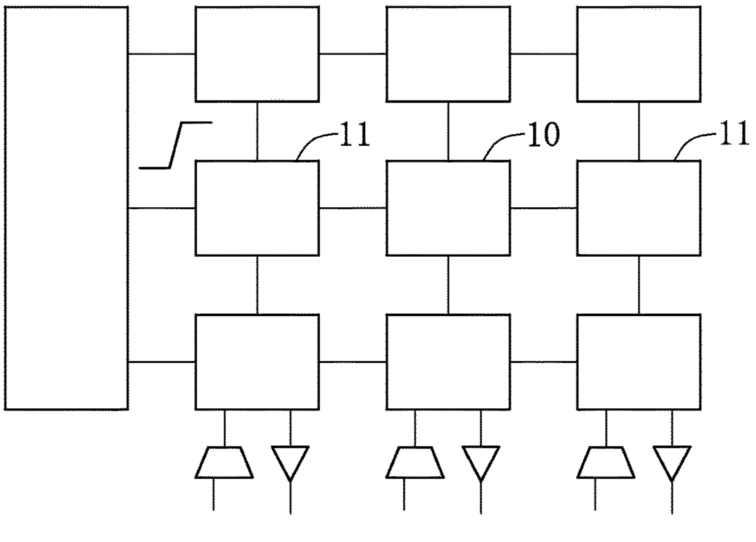
FIG. 3B is a schematic diagram of a conventional 6T static random access memory array.
Figure 3C:
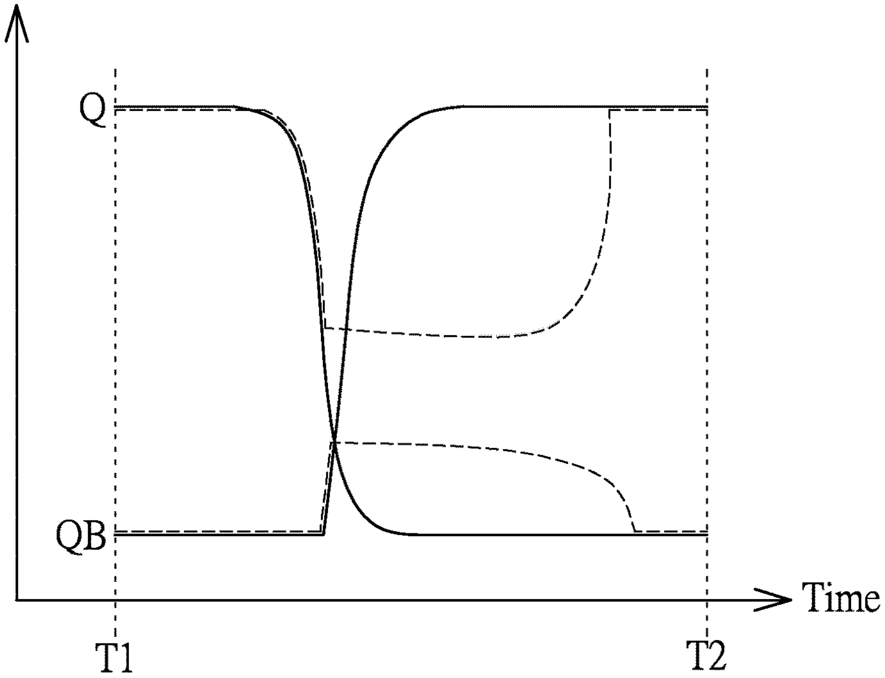
FIG. 3C is a signal diagram of the voltage values of the first node Q and the second node QB of the conventional 6T static random access memory cell while data are being written thereon.

Please refer to FIGS. 2 and 5A-B. Since the first word line WL1 is turned on along with the second high supply voltage CVDD2 being boosted occurs in a different phase from that of the second word line WL2 being turned on along with the first high supply voltage CVDD1 being boosted, the second high supply voltage CVDD2 and the first high supply voltage CVDD1 provide boost voltages $V_{DDA}$ and $V_{DDB}$ when the first node Q and the second node QB in FIGS. 2 and 5A-B are flipping. As a result, storage values are easier to write and the state of the storage values are more stable via the two write phases, which improves upon the errors produced during writing in the conventional 6T status random access memory.

Figure 6A:
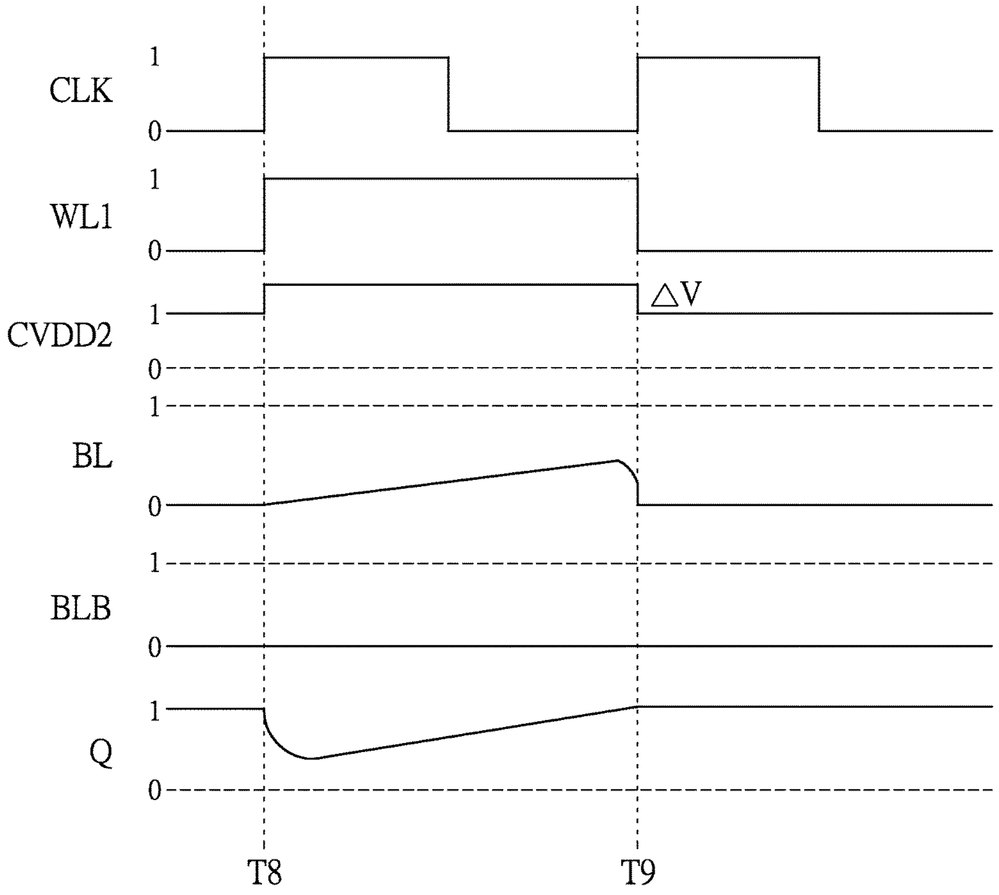
FIG. 6A is a signal diagram of the 6T static random access memory cell while data are being read therefrom in one cycle in accordance with the instant disclosure.

The following discloses the 6T static random access memory cell 4 of FIG. 4 while data are read as the signal changes with storage values variations for first node Q and the second node QB. The data read operation can be performed in one cycle or two phases. Two embodiments shown in FIG. 6A and FIG. 6B respectively show one cycle data read operation and two phases read operation, but the instant disclosure is no not so restricted. When data is read in one cycle, please refer to FIGS. 4 and 6A. Similar to the conventional 6T static random access memory cell, the first bit line BL and the second bit line BLB must be at equal electric potential during the reading process. Notably, after the first bit line BL floats, the first word line WL1 only provides ON signals, meanwhile the second high supply voltage CVDD2 provides a differential voltage ΔV in the instant embodiment. For example: when the storage value of the first node Q is at "0", the electric potential of the first bit line BL changes due to charge sharing or voltage division induced between the first access transistor M5 and the first bit line BL. As shown in FIG. 6A, at time interval T8-T9, the electric potential of the first bit line BL is affected such that voltage is added.

Notably, since the second high supply voltage CVDD2 in the instant embodiment provides a differential voltage ΔV, the voltage $V_{GS}$ from the gate terminal to the source terminal of the second pull-down transistor M4 is smaller compared to that in the conventional 6T static random access memory cell 1, and the stored data are less prone to be lost. Please refer to FIGS. 2 and 6A. During the generation of charge sharing of the first node Q as in FIG. 2, the 6T static random access memory cell of the instant disclosure differs from the conventional 6T static random access memory cell, which simultaneously uses the storage values of the first node Q and the second node QB and, via the first access transistor M5 and the second access transistor M6, generates charge sharing and voltage division respectively with the first bit line BL and the second bit line BLB, such that mutual interference is induced between the storage values of the first node Q and the second node QB. In other words, the 6T static random access memory cell of the instant disclosure executes data reading only via the first node Q and the second high supply voltage CVDD2. In turn, power consumption is relatively less with respect to the conventional cell, and mutual interferences between two nodes are prevented to minimize errors.

Figure 6B:
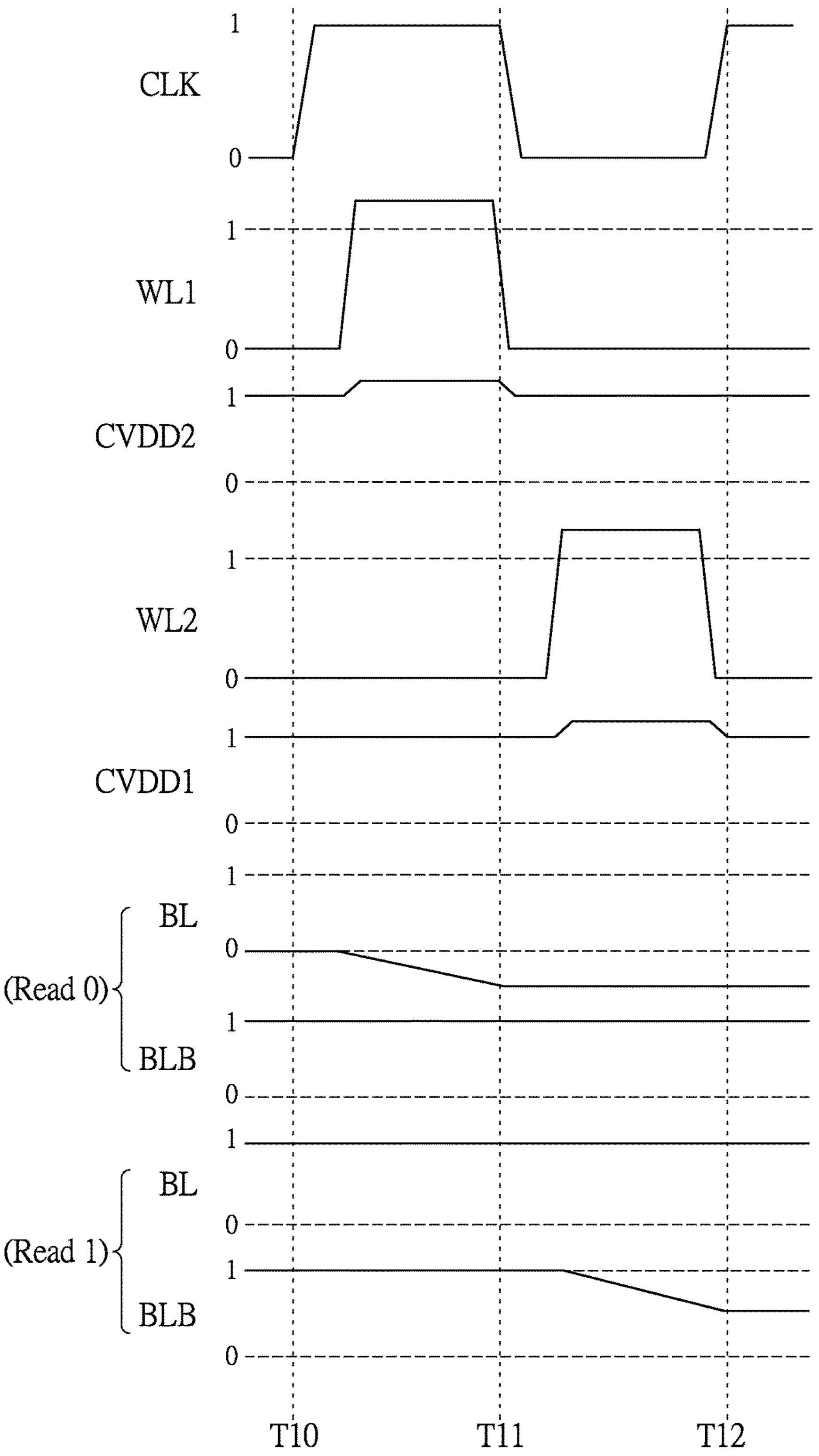
FIG. 6B is a signal diagram of the 6T static random access memory cell while data are being read therefrom in two phases in accordance with the instant disclosure.

Furthermore, considering data reading operation in two phases, please refer to FIGS. 4 and 6B. Similar to the conventional 6T static random access memory cell, the first bit line BL and the second bit line BLB must be at equal electric potential during the reading process. In this embodiment, the 6T static random access memory cell of the instant disclosure has two read phases, so as to perform pseudo-differential read function. A first read phase T10-T11 is for reading "0", and a second read phase T11-T12 is for reading "1". In the first read phase T10-T11, after the first bit line BL floats, the first word line WL1 only provides ON signals, at the same time the second high supply voltage CVDD2 provides a boost voltage $V_{DDA}$ in the instant embodiment. For example, when the storage value of the first node Q is at "0", the electric potential of the first bit line BL changes due to charge sharing or voltage division induced between the first NMOS transistor M5 and the first bit line BL.

Notably, since the second high supply voltage CVDD2 in the instant embodiment provides a boost voltage $V_{DDA}$, the voltage $V_{GS}$ from the gate tell final to the source terminal of the second pull-down transistor M4 is relatively smaller compared to the conventional 6T static random access memory cell 1, and the stored data are less prone to be lost, that is the read stability can be improved. Furthermore, the read time can be saved due to the boost voltage $V_{DDA}$ provided by the high supply voltage CVDD2.

In the second read phase T11-T12, after the second bit line BLB floats, the second word line WL2 only provides ON signals, at the same time the first high supply voltage CVDD1 provides a boost voltage $V_{DDB}$ in the instant embodiment. For example, when the storage value of the second node QB is at "0" (the first node Q is at "1"), the electric potential of the second bit line BLB changes due to charge sharing or voltage division induced between the second NMOS transistor M6 and the second bit line BLB.

Figure 7:
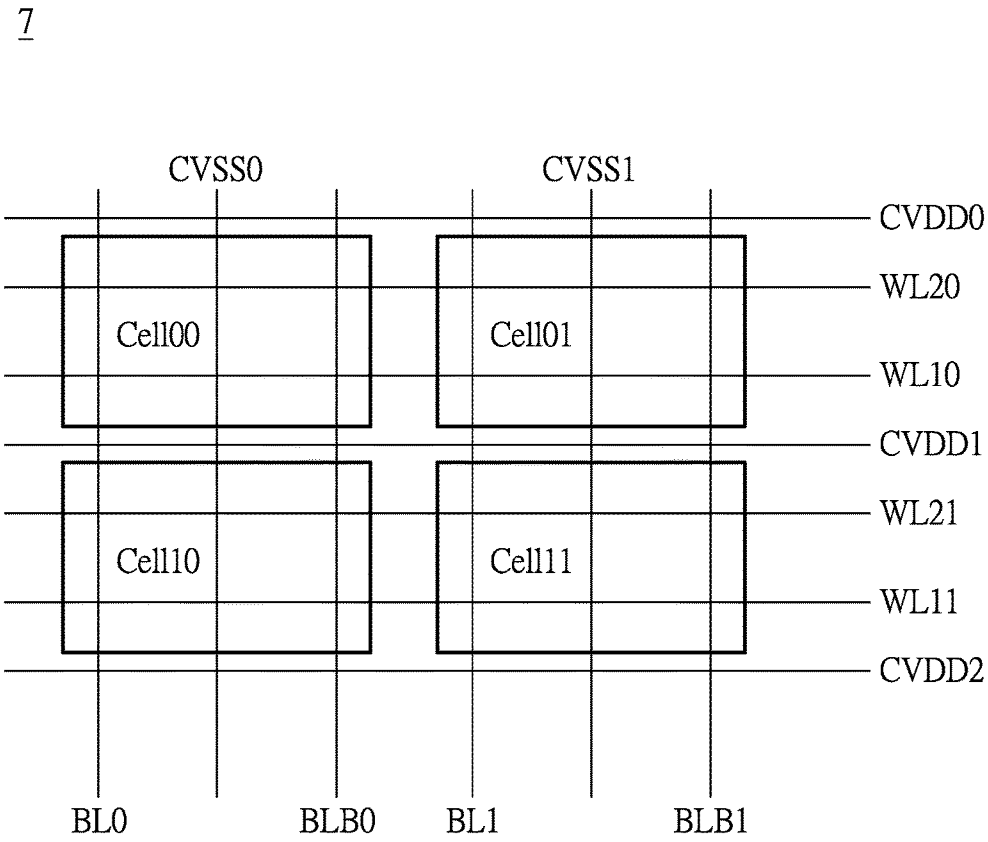
FIG. 7 is a schematic diagram of a 6T static random access memory array in accordance with the instant disclosure.

Please refer to FIG. 7 as a schematic diagram of a 6T static random access memory array in accordance with the instant disclosure. The 6T static random access memory array 7 has at least one of the 6T static random access memory cells Cell00, Cell01, Cell10, and Cell11 as aforementioned or simplified as memory cells hereafter.

In FIG. 7, the memory cells Cell00, Cell10 are coupled to the first low supply voltage CVSS0, the first bit line BL0 and the second bit line BLB0 along the vertical direction, whereas the memory cells Cell01, Cell11 are coupled to the second low supply voltage CVSS1, the third bit line BL1, and the fourth bit line BLB1 along the vertical direction. The memory cells Cell00, Cell01 are coupled to the first high supply voltage CVDD0, the second high supply voltage CVDD1, the first word line WL10, and the second word line WL20, whereas the memory cells Cell10, Cell11 are coupled to the second high supply voltage CVDD1, the third high supply voltage CVDD2, the third word line WL11, and the fourth word line WL21.

Please refer to FIGS. 4 and 7. Memory cell Cell00 has the first pull-up transistor M1, the first pull-down transistor M3, the second pull-up transistor M2, the second pull-down transistor M4, the first NMOS transistor M5, and the second NMOS transistor M6. The drain terminals of the first pull-up transistor M1 and the first pull-down transistor M3 are mutually coupled to form the first node Q, whereas the drain terminals of the second pull-up transistor M2 and the second pull-down transistor M4 are mutually coupled to form the second node QB. The gate terminals of the first pull-up transistor M1, the first pull-down transistor M3, and the second node QB are mutually coupled. The gate terminals of the second pull-up transistor M2, the second pull-down transistor M4, and the first node Q are mutually coupled. The gate terminal of the first NMOS transistor M5 is coupled to the first word line WL10, the source terminal of the first NMOS transistor M5 is coupled to the first node Q, the drain terminal of the first NMOS transistor M5 is coupled to the first bit line BL0. The gate terminal of the second NMOS transistor M6 is coupled to the second word line WL20, the source terminal of the second NMOS transistor M6 is coupled to the second node QB, and the drain terminal of the second NMOS transistor M6 is coupled to the second bit line BLB0. The source terminals of the first pull-up transistor M1 and the second pull-up transistor M2 of the memory cell Cell00 are respectively coupled to the first high supply voltage CVDD0 and the second supply voltage CVDD1. The first pull-down transistor M3 and the second pull-down transistor M4 are cooperatively coupled to the first low supply voltage CVSS0.

The structure of the memory cell Cell10 is similar to that of the memory cell Cell00, and the third and fourth units are only expressed in the memory cell Cell10. The memory cell Cell10 has the third pull-up transistor, the third pull-down transistor, the fourth pull-up transistor, the fourth pull-down transistor, the third NMOS transistor, and the fourth NMOS transistor. The drain terminal of the third pull-up transistor and the drain terminal of the third pull-down transistor mutually couple to form a third node, whereas the drain terminal of the fourth pull-up transistor and the drain terminal of the fourth pull-down transistor mutually couple to form a fourth node. The gate terminal of the third pull-down transistor, the gate terminal of the third pull-up transistor, and the fourth node are mutually coupled, whereas the gate terminal of the fourth pull-down transistor, the gate terminal of the fourth pull-up transistor, and the third node are mutually coupled. The gate terminal of the third NMOS transistor is coupled to the third word line WL11, the source terminal of the third NMOS transistor is coupled to the third node, and the drain terminal of the third NMOS transistor is coupled to the first bit line BL0. The gate terminal of the fourth NMOS transistor is coupled to the fourth word line WL21, the source terminal of the fourth NMOS transistor is coupled to the fourth node, and the drain terminal of the fourth NMOS transistor is coupled to the second bit line BLB0. The source terminal of the third pull-up transistor and the source terminal of the fourth pull-up transistor in the memory cell Cell10 are respectively coupled to the third high supply voltage CVDD2 and the second high supply voltage CVDD1. The third pull-down transistor and the fourth pull-down transistor in the memory cell Cell10 are cooperatively coupled to the first low supply voltage CVSS1.

Notably, the second pull-up transistor M2 of the memory cell Cell00 and the fourth pull-up transistor of the memory cell Cell10 are cooperatively coupled to the second high supply voltage CVDD1. Accordingly, when the third word line WL11 provides ON signals to turn on the third NMOS transistor, the second high supply voltage CVDD1 simultaneously provides the second boost voltage to the fourth node. When the fourth word line WL21 provides ON signals to turn on the fourth NMOS transistor, the third high supply voltage CVDD2 simultaneously provides the third boost voltage to the third node.

The 6T static random access memory array of the instant disclosure provides different high supply voltage to each memory cell, meanwhile a shared high supply voltage is provided between every two adjacent memory cells to further reduce surface area covered by electrical circuits and power consumption.

Figure 8:
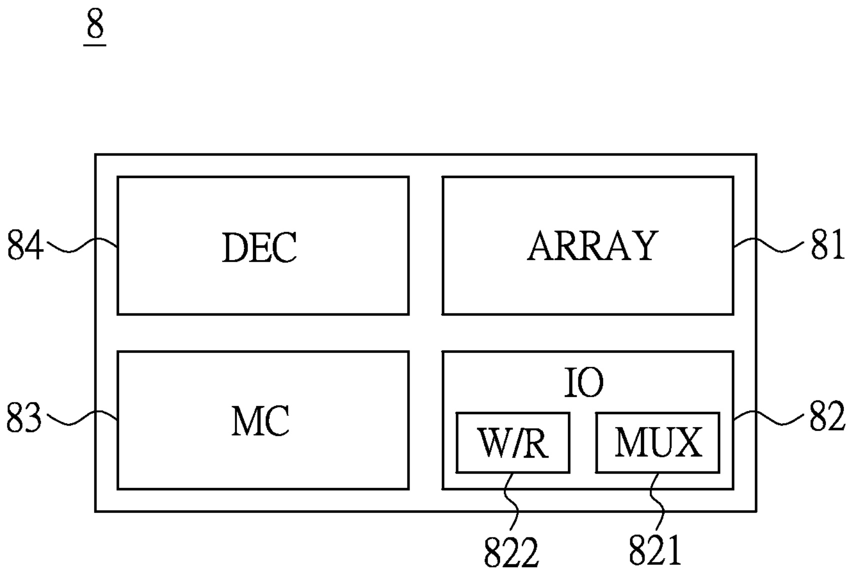
FIG. 8 is a block diagram of a 6T static random access memory in accordance with the instant disclosure.

Please refer to FIG. 8 as a block diagram of a 6T static random access memory in accordance with the instant disclosure. The 6T static random access memory 8 includes a decoding module (DEC) 84, a main control (MC) 83, an input output module (IO) 82, and the 6T static random access memory array 7 as aforementioned (simply known as the memory array 81 hereafter). The input output module 82 includes a read-write circuit (W/R) 822 and a multiplex circuit (MUX) 821. The input output module 82 is coupled to the memory array 81, the main control 83 is coupled to the decoding module 84 and the input output module 82. The decoding module 84, the main control 83, and the input output module 82 include appropriate logic, circuitry, and/or codes, or any processing unit or components having computing capacity, but is not limited hereto.

The input output module 82 can read from or write into the memory array 81 data. The decoding module 84 can decode the selected instruction address or addresses in the memory cell row of the memory array 81, while the main control 83 receives control signals from externally connected circuitry, such that the instruction addresses can be provided to the decoding module 84 or the input output module 82. The input output module 82 includes the read-write circuit 822 and the multiplex circuit 821. The read-write circuit 822 can write data into the memory cell or read data from the memory cell, and the multiplex circuit 821 can decode the selected instruction address or addresses in the memory cell row of the memory array.

In summary, with the 6T static random access memory cell, array and memory in accordance with the instant disclosure, storage values of the first node and the second node can be prevented from interference due to resistive division during reading or writing data. During data reading, conventional circuitry must simultaneously provide voltage to a first NMOS transistor and a second NMOS transistor. However, the instant disclosure provides the memory cell, array, and memory that requires only half the voltage the conventional circuitry would require to be provided to the first NMOS transistor. Moreover, pairing of the first word line and the second high supply voltage can immediately obtain the storage value in the first node, which reduces voltage effectively. Furthermore, the second word line of the instant disclosure does not provide signals because the storage value of the second node does not affect the storage value in the first node, which is relatively less prone to lose stored data. During writing, the first and second word lines are turned on separately in two different time intervals in order to write. While the first word line turns on during reading, the second high supply voltage also provides a boost voltage such that the stored value of the second node is relatively easier to be written compared to conventional arts.

The figures and descriptions supra set forth illustrate the preferred embodiments of the instant disclosure; however, the characteristics of the instant disclosure are by no means restricted thereto. All changes, alterations, combinations or modifications conveniently considered by those skilled in the art are deemed to be encompassed within the scope of the instant disclosure delineated by the following claims.

What is claimed is:

1. A 6T static random access memory cell, comprising:
- a first inverter, comprising:
  - a first pull-up transistor having a source tell final coupled to a first high supply voltage;
  - a first pull-down transistor having a source tell final coupled to a low supply voltage, the first pull-down transistor having a drain terminal coupled to a drain terminal of the first pull-up transistor to form a first node;
- a second inverter, comprising:
  - a second pull-up transistor having a source terminal coupled to a second high supply voltage;
  - a second pull-down transistor having a source tell final coupled to the low supply voltage, the second pull-down transistor having a drain terminal coupled to a drain terminal of the second pull-up transistor to form a second node;
- a first NMOS transistor (metal-oxide-semiconductor field-effect transistor) having a gate terminal coupled to a first word line, the first NMOS transistor having a source terminal coupled to the first node; and
- a second NMOS transistor having a gate terminal coupled to a second word line, the second NMOS transistor having a source terminal coupled to the second node;
- wherein the first word line provides an ON signal to turn on the first NMOS transistor, and the second high supply voltage provides a first boost voltage simultaneously;
- wherein the first word line being turned on occurs at a different time from that of the second word line being turned on.

2. The 6T static random access memory cell as recited in claim 1, wherein when the second word line provides the ON signal such that the second NMOS transistor is turned on, the first high supply voltage provides a second boost voltage simultaneously.

3. The 6T static random access memory cell as recited in claim 2, wherein the first NMOS transistor has a drain terminal coupled to a first bit line, and the second NMOS transistor has a drain terminal coupled to a second bit line.

4. The 6T static random access memory cell as recited in claim 2, wherein the first boost voltage is equal to the second boost voltage.

5. The 6T static random access memory cell as recited in claim 2, wherein before the ON signal is conducting the first NMOS transistor, a first initialization electric potential of the first word line is a logic high level voltage plus a first delta voltage; wherein before the ON signal is conducting the second NMOS transistor, a second initialization electric potential of the second word line is the logic high level voltage plus a second delta voltage.

6. The 6T static random access memory cell as recited in claim 3, wherein while data are being written as "0", the electric potential of the first bit line is equal to or less than the low supply voltage.

7. The 6T static random access memory cell as recited in claim 3, wherein while data are being written as "1", the electric potential of the second bit line is equal to or less than the low supply voltage.

8. The 6T static random access memory cell as recited in claim 3, wherein while data are reading data "0", after the first bit line floats, the first word line provides the ON signal, at the same time the second high supply voltage provides the first boost voltage.

9. The 6T static random access memory cell as recited in claim 3, wherein while data are reading data "1", after the second bit line floats, the second word line provides the ON signal, at the same time the first high supply voltage provides the second boost voltage.

10. A 6T static random access memory array, comprising:
- a first memory cell, comprising:
  - a first inverter coupling to a first high supply voltage and a low supply voltage, and having a first node;
  - a second inverter coupling to a second high supply voltage and the low supply voltage, and having a second node;
  - a first NMOS transistor having a gate tell final coupled to a first word line, the first NMOS transistor having a source terminal coupled to the first node; and
  - a second NMOS transistor having a gate tell final coupled to a second word line, the second NMOS transistor having a source terminal coupled to the second node;
- wherein the first word line provides an ON signal to turn on the first NMOS transistor, and the second high supply voltage provides a first boost voltage simultaneously;
- wherein the first word line being turned on occurs at a different time from that of the second word line being turned on.

11. The 6T static random access memory array as recited in claim 10 further comprising:
- a second memory cell, comprising:
  - a third inverter coupling to a third high supply voltage and the low supply voltage, and having a third node;
  - a fourth inverter coupling to the second high supply voltage and the low supply voltage, and having a fourth node;
  - a third NMOS transistor having a gate tell final coupled to a third word line and a source terminal coupled to the third node; and a fourth NMOS transistor having a gate terminal coupled to a fourth word line and a source terminal coupled to the fourth node;

wherein when the fourth word line provides the ON signal to turn on the fourth NMOS transistor, the third high supply voltage provides a third boost voltage simultaneously.

12. The 6T static random access memory array as recited in claim 10, wherein when the second word line provides the ON signal to turn on the second NMOS transistor, the first high supply voltage provides a second boost voltage simultaneously.

13. The 6T static random access memory array as recited in claim 10, wherein when the third word line provides the ON signal to turn on the third NMOS transistor, the second high supply voltage provides a second boost voltage simultaneously.

14. The 6T static random access memory array as recited in claim 10, wherein the first NMOS transistor has a drain terminal coupled to a first bit line, and the second NMOS transistor has a drain terminal coupled to a second bit line.

15. The 6T static random access memory array as recited in claim 14, wherein while data are reading data “0”, after the first bit line floats, the first word line provides the ON signal, at the same time the second high supply voltage provides the first boost voltage.

16. The 6T static random access memory array as recited in claim 14, wherein while data are reading data “1”, after the second bit line floats, the second word line provides the ON signal, at the same time the first high supply voltage provides the second boost voltage.

17. The 6T static random access memory array as recited in claim 12, wherein the first boost voltage is equal to the second boost voltage.

18. A 6T static random access memory, comprising:

a memory array, comprising:

at least one memory cell, each comprising:

a first inverter, comprising:

a first pull-up transistor having a source terminal coupled to a first high supply voltage; and a first pull-down transistor having a source tell final coupled to a low supply voltage, the first pull-down transistor having a drain terminal coupled to a drain terminal of the first pull-up transistor to form a first node;

a second inverter, comprising:

a second pull-up transistor having a source tell final coupled to a second high supply voltage; and a second pull-down transistor having a source tell final coupled to the low supply voltage, the second pull-down transistor having a drain terminal coupled to a drain terminal of the second pull-up transistor to form a second node;

a first NMOS transistor having a gate terminal coupled to a first word line, the first NMOS transistor having a source terminal coupled to the first node; and a second NMOS transistor having a gate tell final coupled to a second word line, the second NMOS transistor having a source terminal coupled to the second node; and an input output module coupled to the memory array to accessibly read from or write to data the memory array;

wherein the first word line provides an ON signal to turn on the first NMOS transistor, and the second high supply voltage provides a first boost voltage simultaneously;

wherein the first word line being turned on occurs at a different time from that of the second word line being turned on.

19. The 6T static random access memory as recited in claim 18 further comprising:

a decoding module coupled to the memory array for decoding an instruction address chosen from a row of the memory cell in the memory array.

20. The 6T static random access memory as recited in claim 19 further comprising:

a main control coupled to the decoding module and the input output module for providing the instruction address.

21. The 6T static random access memory as recited in claim 18, wherein the input output module further comprising:

a read-write circuit for a datum to be read from or written to the memory cell; and a multiplex circuit for decoding the instruction address chosen from a row of the memory cell in the memory array.

22. The 6T static random access memory as recited in claim 18, wherein when the second word line provides the ON signal to turn on the second NMOS transistor, the first high supply voltage provides a second boost voltage.

23. The 6T static random access memory as recited in claim 18, wherein the first NMOS transistor has a drain terminal coupled to a first bit line, and the second NMOS transistor has a drain terminal coupled to a second bit line.

24. The 6T static random access memory as recited in claim 22, wherein the first boost voltage is equal to the second boost voltage.

25. The 6T static random access memory as recited in claim 22, wherein the first boost voltage is different from the second boost voltage.

26. The 6T static random access memory as recited in claim 23, wherein while data are reading data “0”, after the first bit line floats, the first word line provides the ON signal, at the same time the second high supply voltage provides the first boost voltage.

27. The 6T static random access memory cell as recited in claim 23, wherein while data are reading data “1”, after the second bit line floats, the second word line provides the ON signal, at the same time the first high supply voltage provides the second boost voltage.

* * * * *